(12) United States Patent
Cheng

(10) Patent No.: US 10,312,921 B1
(45) Date of Patent: Jun. 4, 2019

(54) METHOD AND SYSTEM FOR SYNTHESIZER FLICKER NOISE DISPLACEMENT

(71) Applicant: Northrop Grumman Systems Corporation, Falls Church, VA (US)

(72) Inventor: Peter Cheng, Norwalk, CA (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 15/693,566

(22) Filed: Sep. 1, 2017

(51) Int. Cl.
  *H03L 7/093* (2006.01)
  *H02M 3/07* (2006.01)
  *H03L 7/099* (2006.01)

(52) U.S. Cl.
  CPC ............ *H03L 7/093* (2013.01); *H02M 3/07* (2013.01); *H03L 7/099* (2013.01)

(58) Field of Classification Search
  CPC ........... H03L 7/093; H03L 7/099; H02M 3/07

USPC .................. 327/156, 157, 158, 536
See application file for complete search history.

(56) References Cited

U.S. PATENT DOCUMENTS

| | | | |
|---|---|---|---|
| 8,467,749 B2* | 6/2013 | Ozgun ................ | H03F 1/32 455/127.2 |
| 2006/0273835 A1* | 12/2006 | Rodgers ............... | H03L 7/0898 327/157 |
| 2008/0101525 A1* | 5/2008 | Wu ....................... | H03J 3/08 375/376 |

* cited by examiner

*Primary Examiner* — John W Poos
(74) *Attorney, Agent, or Firm* — McCracken & Gillen LLC

(57) ABSTRACT

A system and method of reducing the flicker noise of frequency synthesizers is disclosed. The current source for the synthesizer charge pump current source is modulated so that its flicker noise is displaced to a higher offset frequency. This allows the flicker noise to be filter or nulled out by, for example, a notch filter. The flicker noise can also be modulated into a spread spectrum utilizing sigma delta modulation.

14 Claims, 4 Drawing Sheets

METHOD AND SYSTEM FOR SYNTHESIZER FLICKER NOISE DISPLACEMENT

TECHNICAL FIELD

The invention relates generally to frequency synthesizers and more particularly to reducing flicker noise in frequency synthesizers.

BACKGROUND

Frequency synthesizers are electronic circuits that generate a range of frequencies from a single reference frequency. They are widely used in many different types of devices to tune a transmitter or a receiver to a selected signal frequency of interest, from mobile phones and other communication devices, to televisions and radios, to GPS systems.

Frequency synthesizers commonly use a Phase-Locked Loop (PLL) to provide feedback for a voltage controlled oscillator (VCO) that generates the range of frequencies. A representative prior art system is shown in FIG. 1. A master oscillator 10 is used to generate a reference frequency that is very stable and contains as little noise as possible. A fixed counter 12 divides the reference frequency. It provides an input to phase detector and charge pump 14 which compares the phases of two signals and generates an output signal proportional to the difference between them. This signal is filtered by loop filter 16 and used to control VCO 18 to generate an output frequency. A feedback loop through programmable counter 20 provides the second input to phase detector and charge pump 14 that is compared with the output of fixed counter 12. The feedback loop uses programmable counter 20 to generate a "divided by n" version of the signal output $f_{OUT}$ from VCO 18 which is compared to $f_{REF}$. Thus, the output frequency $f_{OUT}$ is locked such that if the output frequency drifts in phase relative to the reference frequency $f_{REF}$, the output of phase detector and charge pump 14 will increase, driving the frequency in the opposite direction and reducing the error.

Communication systems are vulnerable to large in-band (or near in-band) interferers near the signal frequency of interest which can be magnified by poor close-in (also known as "1-over-f" or flicker) phase noise, generally dominated by local oscillator (LO) and sampling clock frequency sources. A significant contributor to close-in phase noise (within the frequency source, i.e., the PLL hardware) is the frequency synthesizer loop controller's charge pump circuitry.

Thus, a need exists for a PLL frequency synthesizer that reduces the close-in phase noise contribution of the PLL charge pump.

SUMMARY

The invention encompasses a system and method of reducing the flicker noise of frequency synthesizers by modulating the synthesizer charge pump current source so that its flicker noise is displaced to a higher offset frequency where it can be filtered or nulled out, or modulated into a spread spectrum utilizing sigma delta modulation.

In an embodiment, the invention encompasses a digital circuit for removing flicker noise while locking the phase of an output signal to the phase of an input signal, including a reference oscillator for providing the input signal to the digital circuit; a phase detector for receiving the input signal from the reference oscillator and the output of the digital circuit, comparing them and outputting a signal indicating the phase difference between them; a charge pump for receiving the signal output by the phase detector and providing an output, the charge pump further including first and second current source inputs; a first switch operatively coupled between a first current source having flicker noise and both of the first and second current source inputs; a second switch operatively coupled between a second current source having flicker noise and both of the first and second current source inputs; and the digital circuit also including a notch filter for receiving the output of the charge pump, removing a modulated flicker noise in the output due to the first and second current sources.

In a further embodiment, the invention encompasses a frequency synthesizer including a reference oscillator; a frequency divider operatively coupled to the reference oscillator; a phase detector operatively coupled to the frequency divider, said phase detector including a charge pump for receiving the signal output by the phase detector and providing an output, and further comprising first and second current source inputs; a first switch operatively coupled between a first current source having flicker noise and both of the first and second current source inputs; a second switch operatively coupled between a second current source having flicker noise and both of the first and second current source inputs; and a notch filter for receiving the output of the charge pump, removing a modulated flicker noise in the output due to the first and second current sources; the frequency synthesizer also including a loop filter operatively coupled to output of the phase detector; a voltage controlled oscillator coupled to the output of the loop filter; and a programmable counter coupled in a feedback loop between the VCO and the phase detector.

In another embodiment, the first switch of the frequency synthesizer is operatively coupled to the first current source when the second switch is operatively coupled to the second current source.

In a further embodiment, the first and second switches are alternately coupled to the first and second current sources, respectively.

In any of the above embodiments, the first and second switches and first and second current sources are provided by a gain normalizer DAC (digital to analog converter) with modulation.

In an embodiment, the invention encompasses a phase-locked loop circuit or a delay-locked loop circuit incorporating any of the above digital circuits or frequency synthesizers.

In an embodiment, the invention encompasses a communication device incorporating the any of the above digital circuits or frequency synthesizers.

In another embodiment, the invention encompasses a method for removing flicker noise from a digital circuit designed to lock the phase of an output signal to the phase of a reference signal, said digital circuit comprising a phase detector, a charge pump and a notch filter, the method including steps of coupling the output signal and the reference signal to the phase detector; outputting a phase difference signal from the phase detector to the charge pump; alternately coupling two current sources to two inputs of the charge pump so as to modulate flicker noise in the two current sources to a different frequency; and coupling an output of the charge pump to the notch filter for removing the modulated flicker noise frequency.

In a further embodiment, the two current sources are a gain normalizer DAC (digital to analog converter) with modulation.

In another embodiment, the two current sources are modulated into a spread spectrum utilizing sigma delta modulation.

In any of the above embodiments, the method includes the further steps of coupling the output of the notch filter to the input of a loop filter; and coupling the output of the loop filter to the input of a voltage controlled oscillator (VCO) that provides the output signal of the digital circuit.

In any of the above embodiments, the method includes the further steps of generating a signal in a master oscillator as input to a counter that provides a frequency divided version of the master oscillator signal to the phase detector as the reference signal.

DESCRIPTION OF THE DRAWINGS

Features of example implementations of the invention will become apparent from the description, the claims, and the accompanying drawings in which:

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

A principle of the invention is illustrated in connection with FIG. 2. In all three graphs, the horizontal axis is frequency in units of Hz and the vertical axis is noise power in units of dB. A typical flicker noise graph for "1/f" is shown at 30. Flicker noise dominates in the low frequency portion of a spectrum and, for any given electronic circuit, is characterized by a corner frequency $f_C$, which separates the region where the low-frequency flicker noise is dominant in a signal from the region dominated by a more general white noise from other sources. The inherent low frequency nature of flicker noise renders it difficult to filter out.

Figure 2:
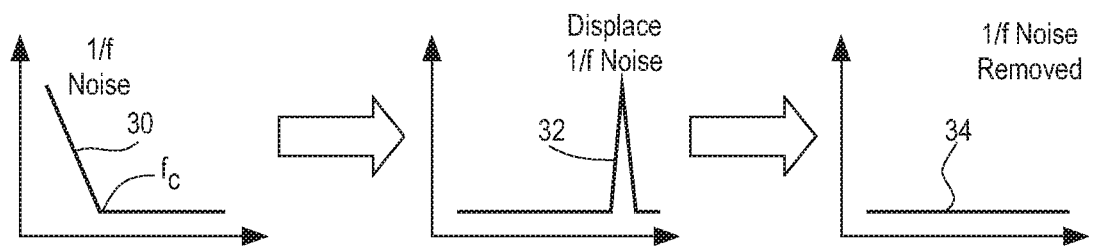
FIG. 2 depicts graphs illustrating a flicker noise removal principle of the invention.

Referring to the flicker noise at 32 of FIG. 2, this graph shows results from sampling the circuitry where flicker noise is dominant, such that flicker noise is modulated to a higher frequency, where it can be easily removed with a typical notch filter, resulting in the signal shown at 34.

Figure 1:
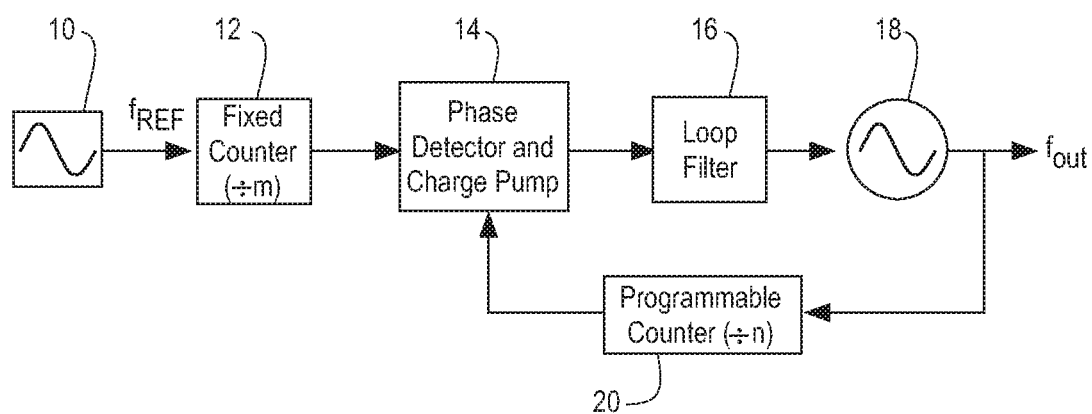
FIG. 1 depicts a prior art phase-locked loop frequency synthesizer.
Figure 3A:
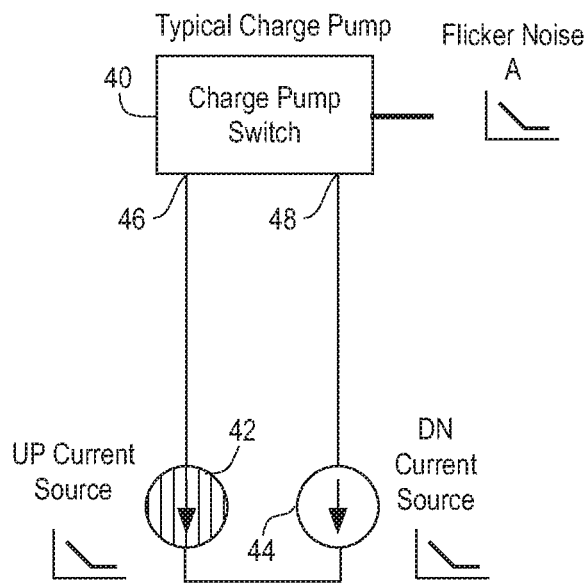
FIG. 3A depicts a prior art charge pump for use in a frequency synthesizer.

A typical charge pump used in a prior art frequency synthesizer is shown in FIG. 3A. Charge pump switch 40 is used in a PLL circuit as a bipolar switched current source. In other words, it outputs positive and negative current pulses from current sources 42 and 44 into the loop filter 16 of FIG. 1. Current sources 42 and 44 are a primary source of flicker noise in a PLL frequency synthesizer. In the prior art, both current sources 42 and 44 are constantly connected to charge pump 40, which uses them to produce positive and negative current pulses. In a typical operation of the PLL, charge pump 40 spends most of its time putting out both positive and negative current pulses concurrently.

Figure 3B:
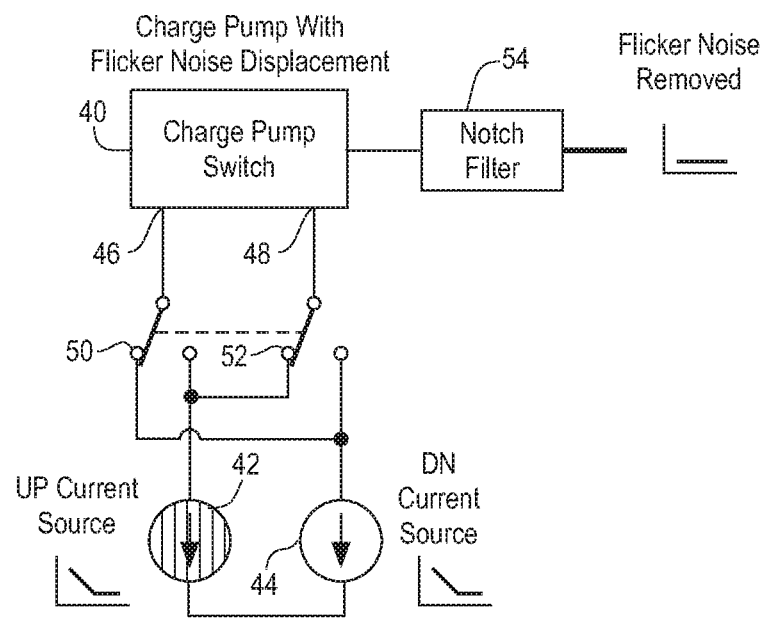
FIG. 3B depicts a charge pump according to the present invention.

A charge pump with flicker noise displacement according to the present invention is representatively shown in FIG. 3B. Elements with the same reference number are the same as those shown in FIG. 3A. Switch 50 is added between input 46 of charge pump switch 40 and UP current source 42. Similarly, switch 52 is coupled between input 48 of charge pump switch 40 and DN current source 44. Each of current sources 42 and 44 are still continuously coupled to charge pump switch 40, however, their connection alternates between inputs 46 and 48 through the use of switches 50 and 52. One of ordinary skill in the art would understand that the architecture in FIG. 3B illustrates the function of an inventive embodiment and that there are a variety of ways current sources 42 and 44 could be generated and coupled to charge pump switch 40 with an alternating mechanism.

Each of current sources 42 and 44 has independently random flicker noise. Alternating the connection of the current sources to charge pump switch 40 results in the currents going thru both polarities of the charge pump in an alternating fashion that enables the modulation of the flicker noise spectrum. In particular, the flicker noise spectrum output by charge pump switch 40 is modulated to a higher frequency, leaving only white noise in the low frequency spectrum. Notch filter 54 removes the modulated flicker noise signal as described in connection with FIG. 2. Switches 50 and 52 are operated at a frequency which is some fraction of the overall operating frequency of the PLL, for example one half or one quarter.

Figure 4:
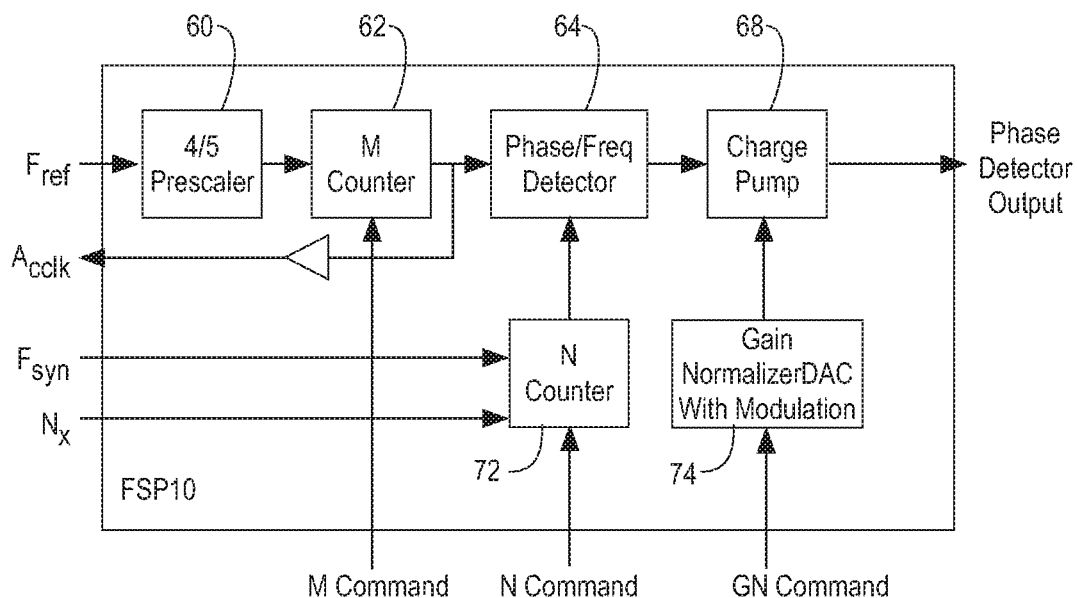
FIG. 4 depicts a phase detector and charge pump for use in a phase-locked loop (PLL) frequency synthesizer according to the present invention.

A frequency synthesizer incorporating a phase detector and the charge pump of FIG. 3B is shown in FIG. 4. A frequency divider 60 receives a reference frequency from a master oscillator 10 of FIG. 1. M counter 62 functions similarly to fixed counter 12 of FIG. 1. N counter 72 receives $f_{syn}$ from a VCO 18 (FIG. 1) as part of a feedback loop described above in connection with FIG. 1. Charge pump 68 converts the output of phase detector 64 to a series of current pulses. Gain Normalizer DAC (digital to analog converter) with Modulation 74 represents a binary programmable version of the current sources shown in FIG. 3B, where each of current sources 42 and 44 switch between connections to charge pump switch 40 for the purpose of displacing the current source flicker noise spectrum.

Figure 5:
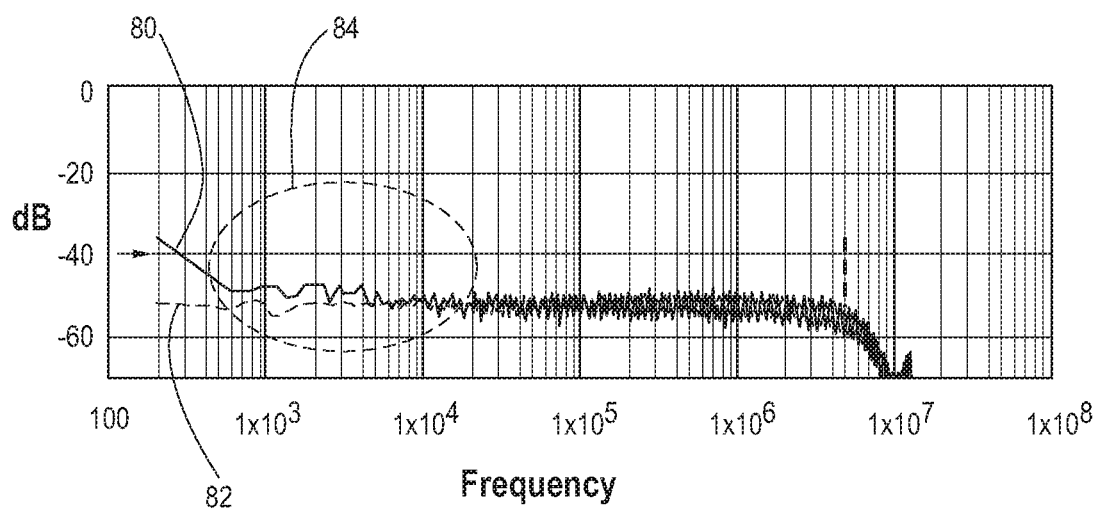
FIG. 5 depicts a graph showing the performance of a frequency synthesizer according to the present invention.

A graph of the output spectrum of a frequency synthesizer according the present invention is shown in FIG. 5. The horizontal axis is frequency in units of Hertz (Hz), and the vertical is noise power in units of decibels (dB). Line 80 shows an output spectrum of a prior art charge pump such as that shown in FIG. 3A. Line 82 shows the output spectrum of the inventive charge pump of FIGS. 3B and 4. As indicated in the lower frequencies indicated at 84, the flicker noise that existed without the invention (shown by line 80 has been displaced by the use of the invention (shown by line 82).

Figure 6A:
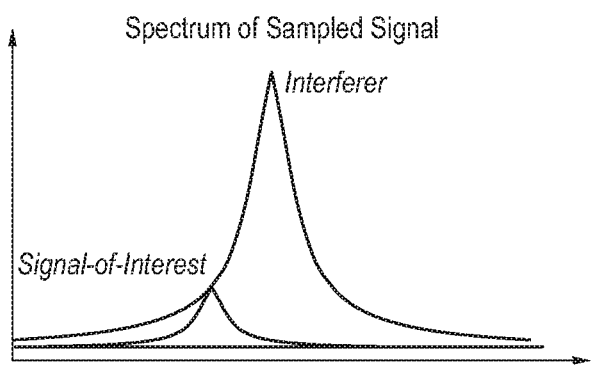
FIGS. 6A and 6B illustrate the spectrum of a sampled signal in the prior art and with the present invention.
Figure 6B:
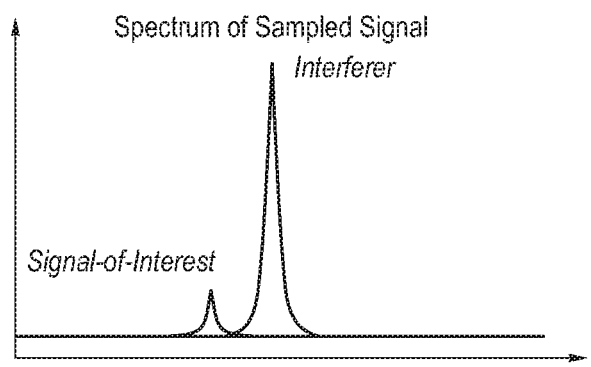

FIG. 6A illustrates the spectrum of a sampled signal of interest in the prior art. The horizontal axis is frequency in units of Hertz (Hz), and the vertical axis is amplitude in units of dB. In this diagram, a high amplitude interferer at a frequency close to the signal-of-interest will make the signal-of-interest impossible to detect. The flicker noise inherent in frequency synthesizers causes the interferer component of an input signal to spread and thus blocking the signal-of-interest. In contrast, with the present invention, FIG. 6B shows the benefit of displacing flicker noise. This results in narrowing the spectrum of the interferer so that the signal-of-interest can be detected.

Principles of the invention as disclosed herein are applicable to delay-locked loop (DLL) clock/phase recovery circuits, in addition to PLL frequency synthesizers.

The apparatus in one example comprises a plurality of components such as one or more of electronic components. A number of such components can be combined or divided in the apparatus.

The steps or operations described herein are just for example. There may be many variations to these steps or operations without departing from the spirit of the invention. For instance, the steps may be performed in a differing order, or steps may be added, deleted, or modified.

Although example implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. A digital circuit for removing flicker noise while locking the phase of an output signal to the phase of an input signal, comprising:
   a reference oscillator for providing the input signal to the digital circuit;
   a phase detector for receiving the input signal from the reference oscillator and the output of the digital circuit, comparing them and outputting a signal indicating the phase difference between them;
   a charge pump for receiving the signal output by the phase detector and providing an output, and further comprising first and second current source inputs;
   a first switch operatively coupled to the first current source input that alternately connects the first current source input between first and second current sources having flicker;
   a second switch operatively coupled to the second current source input that alternately connects the second current source input between the first and second current source having flicker noise, the second switch connecting one of the first and second current sources to the second current source input while the first switch connects the other of the first and second current sources to the first current source input; and
   a notch filter for receiving the output of the charge pump, removing a modulated flicker noise in the output due to the first and second current sources.

2. The digital circuit of claim 1 wherein the first and second switches and first and second current sources are provided by a gain normalizer DAC (digital to analog converter) with modulation.

3. A phase-locked loop circuit incorporating the digital circuit of claim 1.

4. A delay-locked loop circuit incorporating the digital circuit of claim 1.

5. A frequency synthesizer, comprising:
   a reference oscillator;
   a frequency divider operatively coupled to the reference oscillator;
   a phase detector operatively coupled to the frequency divider, said phase detector further comprising:
      a charge pump for receiving the signal output by the phase detector and providing an output, and further comprising first and second current source inputs;
      a first switch operatively coupled between a first current source having flicker noise and both of the first and second current source inputs;
      a second switch operatively coupled between a second current source having flicker noise and both of the first and second current source inputs; and
      a notch filter for receiving the output of the charge pump, removing a modulated flicker noise in the output due to the first and second current sources;
   a loop filter operatively coupled to output of the phase detector;
   a voltage controlled oscillator coupled to the output of the loop filter; and
   a programmable counter coupled in a feedback loop between the VCO and the phase detector.

6. The frequency synthesizer of claim 5 wherein the first switch is operatively coupled to the first current source when the second switch is operatively coupled to the second current source.

7. The frequency synthesizer of claim 6 wherein the first and second switches are alternately coupled to the first and second current sources, respectively.

8. The frequency synthesizer of claim 5 wherein the first and second switches and first and second current sources are provided by a gain normalizer DAC (digital to analog converter) with modulation.

9. A communication device incorporating the frequency synthesizer of claim 5.

10. A method for removing flicker noise from a digital circuit designed to lock the phase of an output signal to the phase of a reference signal, said digital circuit comprising a phase detector, a charge pump and a notch filter, the method comprising the steps of:
    coupling the output signal and the reference signal to the phase detector;
    outputting a phase difference signal from the phase detector to the charge pump;
    alternately coupling a first current source to one of two inputs of the charge pump while simultaneously alternately coupling a second current source to the other of the two inputs of the charge pump so as to modulate flicker noise in the first and second current sources to a different frequency; and
    coupling an output of the charge pump to the notch filter for removing the modulated flicker noise frequency.

11. The method of claim 10, wherein the two current sources are a gain normalizer DAC (digital to analog converter) with modulation.

12. The method of claim 11, wherein the two current sources are modulated into a spread spectrum utilizing sigma delta modulation.

13. The method of claim 10, further comprising the steps of:
    coupling the output of the notch filter to the input of a loop filter; and
    coupling the output of the loop filter to the input of a voltage controlled oscillator (VCO) that provides the output signal of the digital circuit.

14. The method of claim 13, further comprising the step of:

generating a signal in a master oscillator as input to a counter that provides a frequency divided version of the master oscillator signal to the phase detector as the reference signal.

\* \* \* \* \*